United States Patent [19]

Heimlicher

[11] Patent Number: 5,767,444
[45] Date of Patent: Jun. 16, 1998

[54] PROXIMITY SWITCH WITH CERAMIC FRONT SURFACE AND METHOD FOR ITS MANUFACTURE

[75] Inventor: Peter Heimlicher, Freiburg, Switzerland

[73] Assignee: Optosys AG, Villars-sur-Glane, Switzerland

[21] Appl. No.: 507,710

[22] Filed: Jul. 26, 1995

[30] Foreign Application Priority Data

Jul. 26, 1994 [CH] Switzerland ............... 02358/94

[51] Int. Cl.$^6$ ............................................. H01J 5/00
[52] U.S. Cl. ................ 174/50.61; 29/447; 174/DIG. 8
[58] Field of Search .......................... 29/447; 251/335.3; 257/680; 219/130.01; 174/50.61, 52.3, 52.4, 50.63, DIG. 63

[56] References Cited

U.S. PATENT DOCUMENTS

| | | | |
|---|---|---|---|
| 4,604,678 | 8/1986 | Hagner | 361/761 |
| 4,697,325 | 10/1987 | Kamigaito et al. | 29/447 |
| 4,755,637 | 7/1988 | Turck | 200/82 R |
| 4,795,134 | 1/1989 | Lanfri | 251/335.3 |
| 4,996,408 | 2/1991 | Turck et al. | 219/130.01 |
| 5,256,901 | 10/1993 | Ohashi et al. | 257/680 |

FOREIGN PATENT DOCUMENTS

| | | |
|---|---|---|
| 0197890 | 10/1986 | European Pat. Off. |
| 0466971 | 1/1992 | European Pat. Off. |
| 3313826 | 11/1983 | Germany |
| 3545135 | 6/1986 | Germany |
| 4032803 | 4/1992 | Germany |

Primary Examiner—Kristine L. Kincaid
Assistant Examiner—Dhiru R. Patel
Attorney, Agent, or Firm—Foley & Lardner

[57] ABSTRACT

A ceramic portion is inserted in the front side of the housing envelope by shrinking. At the the junction of these parts, a sealing layer, preferably a galvanized copper layer, is applied plied which ensures a connection which under the resulting pressure is impermeable to gases and humidity. The ceramic portion is exposed to a strong radial pressure prestress with the result that the tensile stress of the ceramic portion is reduced and thus the pressure resistance thereof is increased under the effect of an axially acting external pressure.

6 Claims, 1 Drawing Sheet

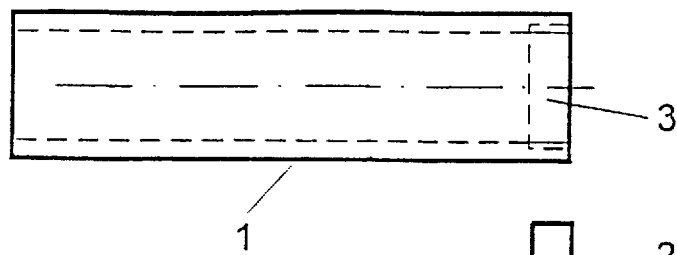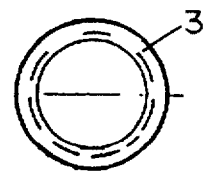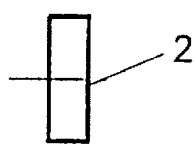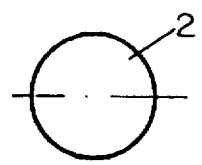
Fig. 1A  Fig. 1B
Fig. 2A  Fig. 2B
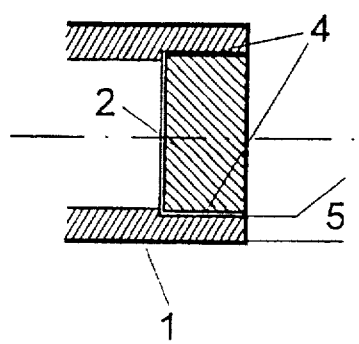
Fig. 3
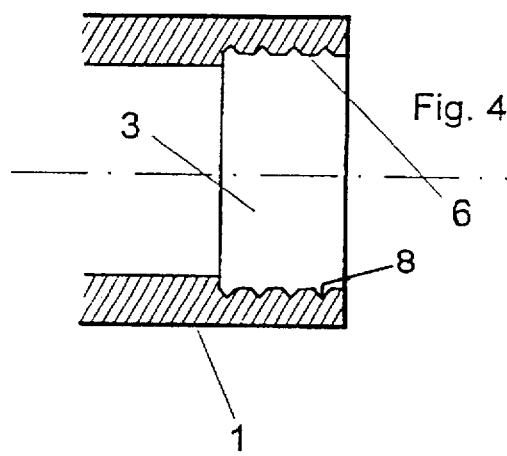
Fig. 4
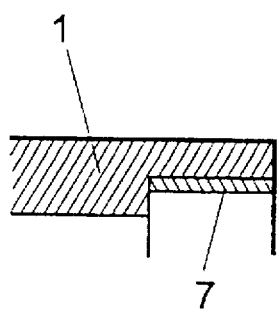
Fig. 5
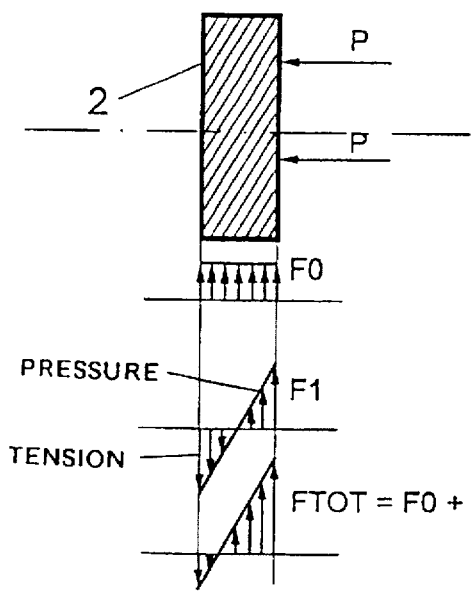
Fig. 6

PROXIMITY SWITCH WITH CERAMIC FRONT SURFACE AND METHOD FOR ITS MANUFACTURE

BACKGROUND OF THE INVENTION

According to their application, proximity switches of different technologies (inductive, capacitive, ultrasonic, magnetic and others) are subject to high stresses due to environmental influences. The resulting need for protection of the structural components contained therein is an important requirement. Consequently, the currently available devices are mostly complete with casings of metal or high-quality plastics which are generally filled with casting resin in addition.

In practice, however, there are applications where these measures are insufficient, e.g. in the presence of aggressive chemicals, high temperatures and pressures, as well as in the foodstuff industry. In these cases, housings of special steel are used. In this context, the active surface is of special interest since in general, it must be made of an elec-trically insulating material. Materials of choice for this purpose are ceramic materials.

The problem involving difficulties consists in the gas- and liquid-tight junction between the ceramic active surface and the housing, which must fulfill high requirements. Not only should it be tight, but also pressure-resistant, vibration-resistant, and applicable in a wide temperature range. Furthermore, a very high resistance to temperature cycles is required. An excellent chemical stability is indisas pensable. All these properties must be conserved during the full lifetime of the product, which typically exceeds ten years. In addition, the manufacturing method should be simple, safe, and first of all, economical.

Another problem is the fact that the active surface should be as thin as possible, for the useful switching distance of the sensor is naturally reduced by its thickness. This is particularly important if the appliance is intended for high external pressures.

A number of solutions to the stated problem are known, all of which involve essential inconvenience, however. The safest method consists in metalizing the ceramic portion in the area of the connecting surface and then soldering it tightly to the housing. The obtained result is very good, but the manufacturing process is complicated and thus expensive. Another method consists in cementing the parts with a suitable cement. Although this is economical, it is unsafe, especially under higher temperatures and in an aggressive environment.

SUMMARY OF THE INVENTION

The present invention solves the mentioned problems in a simple and economical manner by means of a proximity switch wherein the ceramic portion is inserted in the housing envelope by shrinking, and wherein a sealing material disposed between said housing envelope and said ceramic portion provides a seal which is impermeable to gases and liquids; and by a manufacturing method wherein the sealing connection of the ceramic portion to the housing envelope is obtained by inserting said ceramic portion, which at ambient temperature has a greater diameter than the corresponding seat in the housing envelope, into the housing envelope after the latter has been heated, said ceramic portion being positively maintained due to the shrinking of said housing envelope when the latter has cooled off, in such a manner that a gas- and liquid-tight seal between the housing envelope and the ceramic portion is obtained due to a surface coating of the housing envelope in the area of the junction.

BRIEF DESCRIPTION OF THE DRAWINGS

The invention is explained in more detail hereinafter with reference to an embodiment which is illustrated in the drawing.

FIGS. 1 and 2 show lateral respective front views of the parts to be connected to the housing;

FIG. 3 shows the parts which are connected by shrinking;

FIG. 4 shows an alternative embodiment having a surface structure increasing the contact pressure;

FIG. 5 shows a sealing layer; and

FIG. 6 shows the forces acting upon the inserted ceramic part.

DETAILED DESCRIPTION OF THE INVENTION

The invention starts from a method which is being used for other purposes and known Per se, and which consists in shrinking a metal portion onto a corresponding internal portion of a ceramics material. Examples thereof are found in DE-A-40 32 803, DE-A-40 21 259, EP-A-0 197 890 and DE-C-35 45 135. For this purpose, the diameter of disc-shaped ceramics portion 2 is made slightly greater than that of the corresponding seat 3 in housing envelope 1. In order to insert ceramics portion 2 into housing envelope 1, the latter is heated to a temperature of e.g. 800° C. in the area of seat 3. The heating may be effected simply and quickly in a known manner by inductive means. The housing envelope 1 is thereby expanded (the linear dilatation coefficient being approx. $12 \times 10^{-6}/°$ C., for example, in the case of V2A). The ceramics portion 2, which is not heated and therefore not expanded, is now inserted without any expenditure of force into the corresponding seat 3 of housing envelope 1. The supply of energy is then interrupted, whereupon the entire arrangement cools off. On account of the resulting shrinking of housing 1, a firm connection between housing 1 and ceramics portion 2 is obtained without any further operations.

The connection thus obtained may be characterized by intense compression, but it is generally not gas and liquid-tight. According to the invention, the surface of the metal housing envelope 1 is therefore previously treated, i.e. typically through the application of a suitable layer 7 (FIG. 5) of a ductile metal, e.g. copper, having a thickness in the order of some 10 μm, in the area of the junction 4 (FIG. 4). Thus, an excellent seal results if the coat thickness and the surface pressure are suitably dimensioned. It is most advantageous to first treat the entire housing envelope and to remove, as desired, the portions of the coat that are no longer required after the connection has been established, the coat being conserved in the area of the junction due to the gas- and liquid-tight seal.

By an appropriate choice of the materials and of the wall thickness 5 of the housing in the area of seat 3, the desired surface pressure can be adjusted in a wide range. In addition, said range can be further enlarged by a corresponding design of contact surface 6. An example thereof is shown in FIG. 4, where annular grooves 8 are provided in contact surface 6.

Another advantage results from the prestress of ceramic portion 2 which can bear a higher external pressure P at a given shape than would be possible without such a prestress (FIG. 6). This takes advantage of the fact that ceramic materials may be exposed to substantially higher pressures than tensions. The prestress caused by the pressure resulting from the shrinking of the metal housing portion creates the pressure F0 in ceramic portion 2 (FIG. 6). An external pressure P creates pressures and tensions F1. Due to their superposition, the pressures and tensions F1 created by external pressure P are respectively increased (pressures) and reduced (tensions) by the amount of the pressure F0. The resulting tensions, whose sum is reduced, thus allow a higher stress of ceramic portion 2 by external pressure P than would be allowable without the mentioned prestress. Advantageously, the junction is so designed that the limit of elasticity of the housing material is exceeded in the area of the contact surface 4 after it has cooled off. This allows a prestress which is largely independent of machining tolerances.

I claim:

1. A proximity switch comprising:

a metallic housing envelope having a substantially tubular end portion;

a disc-shaped closure retained within said tubular end portion; and a sealing material disposed between the disc-shaped closure and said tubular end portion, said tubular end portion being shrunk onto the disc-shaped closure and exerting radial pressure on the disc-shaped closure and the sealing material, said exerted radial pressure on the sealing material being sufficient to provide a seal between the disc-shaped closure and said tubular end portion that is impermeable to gases and liquids.

2. The proximity switch of claim 1, wherein a ductile metal serves as the sealing material.

3. The proximity switch of claim 1, wherein the sealing material is applied to a contact surface of the housing envelope.

4. A proximity switch comprising:

a metallic housing envelope having a substantially tubular end portion;

a disc-shaped closure retained within said tubular end portion; and a sealing material disposed between the disc-shaped closure and said tubular end portion, said tubular end portion being shrunk onto the disc-shaped closure and exerting radial pressure on the disc-shaped closure and the sealing material, at least one of opposing surfaces of the disc-shaped closure and said tubular end portion comprising at least one annular groove for locally increasing said exerted radial pressure on the sealing material, said radial pressure exerted on the sealing material being sufficient to provide a seal between said tubular end portion and the disc-shaped closure that is impermeable to gases and liquid.

5. A proximity switch comprising:

a metallic housing envelope having a substantially tubular end portion;

a disc-shaped closure retained within said tubular end portion; and a sealing material disposed between said tubular end portion and the disc-shaped closure, said tubular end portion being shrunk onto the disc-shaped closure and exerting radial pressure on the sealing material and the disc-shaped closure, said tubular end portion being under stress exceeding the limit of elasticity of said tubular end portion, said tubular end portion exerting said radial pressure on the sealing material sufficient to provide a seal between said tubular end portion and the disc-shaped closure that is impermeable to gases and liquids.

6. A proximity switch comprising:

A metallic housing envelope;

a ceramic closure retained within the housing envelope; and a sealing material disposed between the housing envelope and the ceramic closure, the ceramic closure being retained in the housing envelope by shrinking of the housing envelope, at least one of opposing surfaces of the housing envelope and the ceramic closure comprising one or more grooves for locally increasing exerted radial pressure on the sealing material, a surface pressure of the housing envelope in an area of the ceramic closure exceeding the limit of elasticity of the housing envelope, said radial pressure exerted by the housing envelope on the sealing material being sufficient to provide a seal between the housing envelope and the ceramic closure that is impermeable to gases and liquids.

* * * * *